United States Patent
Yamakoshi

(10) Patent No.: US 8,114,341 B2
(45) Date of Patent: Feb. 14, 2012

(54) NICKEL ALLOY SPUTTERING TARGET AND NICKEL SILICIDE FILM

(75) Inventor: Yasuhiro Yamakoshi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 13/003,342

(22) PCT Filed: Jan. 22, 2010

(86) PCT No.: PCT/JP2010/050762
§ 371 (c)(1),
(2), (4) Date: Feb. 16, 2011

(87) PCT Pub. No.: WO2010/092863
PCT Pub. Date: Aug. 19, 2010

(65) Prior Publication Data
US 2011/0135942 A1    Jun. 9, 2011

(30) Foreign Application Priority Data
Feb. 10, 2009   (JP) .................. 2009-028005

(51) Int. Cl.
C22C 19/03 (2006.01)
(52) U.S. Cl. ........................ 420/456; 148/426
(58) Field of Classification Search ............. 204/298.13; 420/456; 148/426
See application file for complete search history.

(56) References Cited

U.S. PATENT DOCUMENTS

| | | | |
|---|---|---|---|
| 4,765,845 A * | 8/1988 | Takada et al. | 136/258 |
| 5,302,552 A | 4/1994 | Duchateau et al. | |
| 5,460,793 A | 10/1995 | Kano et al. | |
| 5,618,397 A | 4/1997 | Kano et al. | |
| 5,840,626 A | 11/1998 | Ohguro | |
| 5,989,988 A | 11/1999 | Iinuma et al. | |
| 6,267,827 B1 | 7/2001 | Shindo et al. | |
| 6,423,196 B1 * | 7/2002 | Ivanvov | 204/298.13 |
| 6,485,542 B2 | 11/2002 | Shindo et al. | |
| 6,723,183 B2 | 4/2004 | Oda et al. | |
| 6,986,834 B2 | 1/2006 | Irumata et al. | |
| 7,241,368 B2 | 7/2007 | Irumata et al. | |
| 7,517,515 B2 | 4/2009 | Irumata et al. | |
| 7,605,481 B2 | 10/2009 | Yamakoshi et al. | |
| 7,618,505 B2 | 11/2009 | Yamakoshi et al. | |
| 7,674,446 B2 | 3/2010 | Irumata et al. | |
| 7,740,718 B2 | 6/2010 | Yamakoshi et al. | |
| 2006/0037680 A1 | 2/2006 | Yamakoshi | |
| 2006/0057014 A1 | 3/2006 | Oda et al. | |
| 2006/0292028 A1 | 12/2006 | Shindo et al. | |
| 2007/0098590 A1 | 5/2007 | Shindo | |
| 2008/0116438 A1 | 5/2008 | Lee et al. | |
| 2009/0173627 A1 | 7/2009 | Suzuki | |
| 2010/0242674 A1 | 9/2010 | Shindo et al. | |

FOREIGN PATENT DOCUMENTS

| | | |
|---|---|---|
| JP | 07-038104 A | 2/1995 |
| JP | 2003-096525 A | 4/2003 |
| JP | 2004-217967 A | 8/2004 |
| JP | 2008-153633 A | 7/2008 |
| WO | 2005/083138 A1 | 9/2005 |

OTHER PUBLICATIONS

Terry, L. E.; Saltich, Jack; , "Schottky barrier heights of nickel-platinum silicide contacts on n- type Si," Applied Physics Letters , vol. 28, No. 4, pp. 229-231, Feb. 1976.*
Abstract and English Machine Translation of Yamakoshi (JP 2004-217967) (2004).*
Abstract and English Machine Translation of Ro et al. (JP 2003-096525) (2003).*

* cited by examiner

Primary Examiner — Jessee R. Roe
(74) Attorney, Agent, or Firm — Howson & Howson LLP

(57) ABSTRACT

Provided are a nickel alloy sputtering target, and a nickel silicide film formed with such a target, enabling the formation of a thermally stable silicide (NiSi) film, scarcely causing the aggregation of films or excessive formation of silicides, having low generation of particles upon forming the sputtered film, having favorable uniformity and superior plastic workability to the target, and which is particularly effective for the manufacture of a gate electrode material (thin film). This nickel alloy sputtering target contains 22 to 46 wt % of platinum and 5 to 100 wtppm of one or more components selected from iridium, palladium, and ruthenium, and remainder is nickel and inevitable impurities.

1 Claim, 1 Drawing Sheet

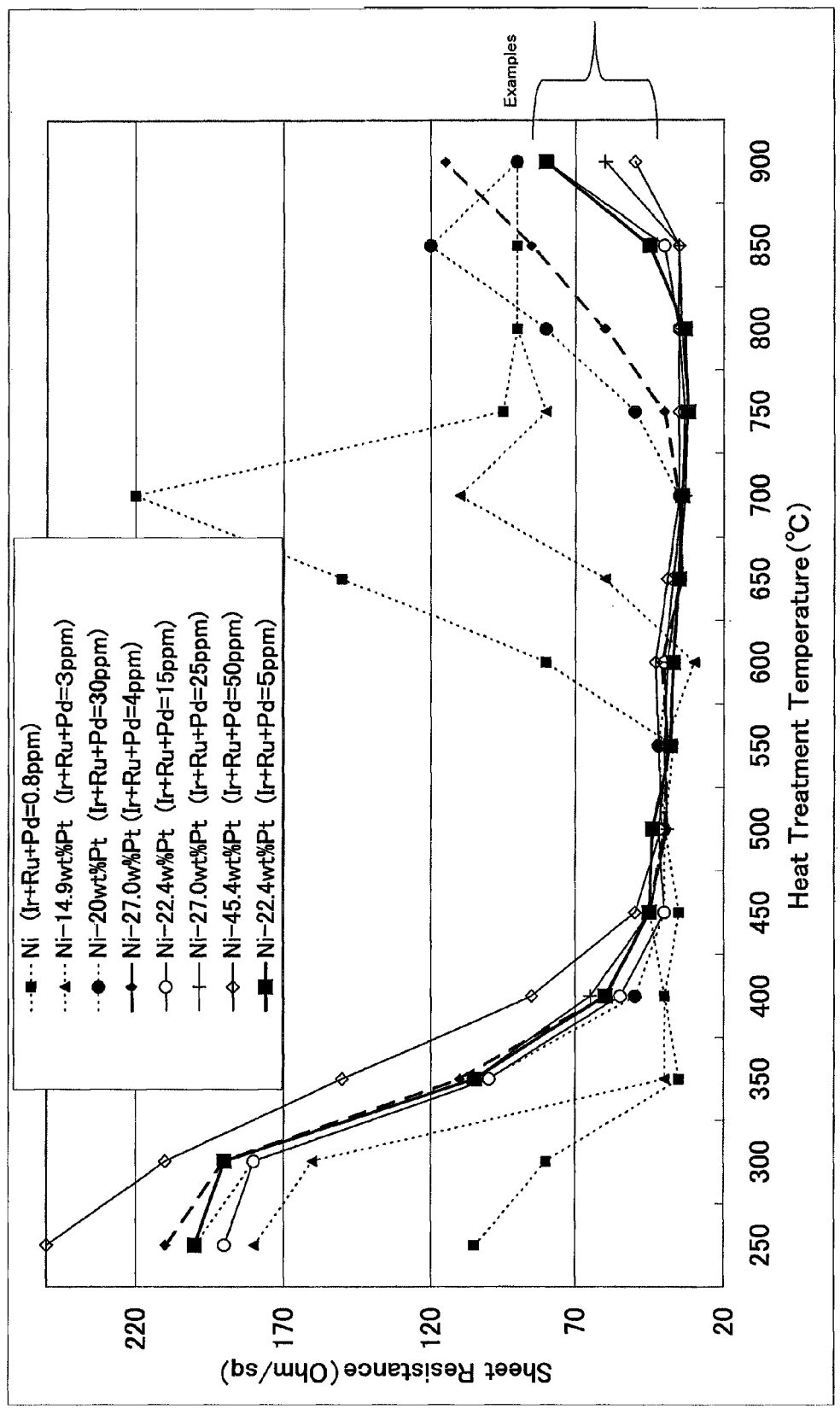

NICKEL ALLOY SPUTTERING TARGET AND NICKEL SILICIDE FILM

BACKGROUND OF THE INVENTION

The present invention relates to a nickel alloy sputtering target enabling the formation of a thermally stable nickel silicide (NiSi) film, having favorable plastic workability to the target, and which is particularly effective in the production of a gate electrode material (thin film), as well as to a nickel silicide film formed with such a target.

In recent years, the use of a NiSi film in the salicide process as the gate electrode material is paid attention. Nickel, compared to cobalt, is characterized in that it is capable of forming a silicide film with less consumption of silicon during the salicide process. Further, NiSi, as with a cobalt silicide film, is characterized in that the increase of fine wire resistance pursuant to the refinement of wiring scarcely occurs.

In light of the above, nickel is being used in substitute of the expensive cobalt as the gate electrode material. Nevertheless, in the case of NiSi, it is easily subject to a phase transition to a more stable phase of $NiSi_2$, and there is a problem of the boundary roughness becoming aggravated and highly resistive. Moreover, there are other problems in that the film is easily aggregated and excessive formation of silicides often occurs.

Conventionally, as technology of using a nickel silicide film or the like, there is technology of capping and annealing a metal compound film such as TiN on a Ni or Co film to prevent the formation of an insulation film by reacting with oxygen at the time of forming the silicide film. Here, TiN is used to prevent the formation of an irregular insulation film by the reaction of oxygen and Ni.

When the irregularities are small, since the length from the NiSi film to the bonding of the source/drain diffusion layer will be long, it is said that the bonding leak can be inhibited. In addition, TiC, TiW, TiB, $WB_2$, WC, BN, AlN, $Mg_3N_2$, CaN, $Ge_3N_4$, TaN, $TbNi_2$, $VB_2$, VC, ZrN, ZrB and the like are also disclosed as the cap film (refer to Patent Document 1).

Further, with conventional technology, problems have been pointed out in that NiSi is easily oxidized even within the silicide material, large irregularities are formed on the boundary area of the NiSi film and Si substrate, and a bonding leak will occur.

Here, a solution has been taken that sputtering a TiN film on the Ni film as a cap film, and subjecting this to heat treatment is to nitride the surface of the NiSi film. This aims to prevent the NiSi from oxidizing, and suppress the formation of irregularities. Nevertheless, since the nitride film on the NiSi formed by accumulating TiN on Ni is thin, a problem remains in that it is difficult to maintain the barrier properties for a long period of time.

Thus, a solution has been taken that forming the silicide film under a mixed gas (2.5 to 10%) atmosphere with nitrogen gas added thereto is to make the roughness of the silicide film 40 nm or less, and the grain size 200 nm or more. Here, it is desirable to cap one among Ti, W, TiNx and WNx on Ni.

Here, it is also described sputtering Ni with only argon gas that is free of nitrogen gas, subsequently sputtering the cap film of TiN, and thereafter injecting N ions into the Ni film to add N into the Ni film (refer to Patent Document 2).

Further, as conventional technology, a semiconductor device and the manufacturing method are disclosed, and the combination of primary metals such as Co, Ni, Pt or Pd and secondary metals such as Ti, Zr, Hf, V, Nb, Ta or Cr is described. The Examples use the Co—Ti combination.

Cobalt has a lower capability of reducing the silicon oxide film compared to titanium, and the silicide reaction will be inhibited if there is a natural oxide film existing on the silicon substrate or polysilicon film surface upon depositing cobalt. Further, the heat resistance properties are inferior to a titanium silicide film, and problems have been pointed out in that the heat upon depositing the silicon oxide film as the interlayer film after the completion of the salicide process causes the cobalt disilicide ($CoSi_2$) film to aggregate and the resistance to increase (refer to Patent Document 3).

Further, as conventional technology, there is a disclosure of a "manufacturing method of a semiconductor device," and technology is described for where an amorphous alloy layer with a metal selected from a group consisting of titanium, zirconium, tantalum, molybdenum, niobium, hafnium, and tungsten is formed on cobalt or nickel to prevent the short-circuit caused by the overgrowth upon forming salicide. Here, although there are Examples that show a cobalt content of 50 to 75 at % and Ni 40, Zr 60, the alloy content is large for making an amorphous film (refer to Patent Document 4).

As described above, all of the disclosed conventional technologies relate to the deposition process, and do not relate to a sputtering target. Further, with the conventional high purity nickel, the purity was roughly up to 4N excluding gas components, and the oxygen content was high at roughly 100 ppm. As a result of producing a nickel alloy target based on this kind of conventional nickel, plastic workability was inferior and it was not possible to produce a high quality target. In addition, there was a problem in that numerous particles were generated during sputtering, and the uniformity was inferior.

In light of the problems of the foregoing gate electrode material, the present inventors developed a sputtering target material in which titanium or platinum is added to nickel as a particularly superior material, and proposed the inhibition of the phase transition to $NiSi_2$ as the stable phase (refer to Patent Document 5 and Patent Document 6).

In this proposal, the nickel alloy added with platinum was the most effective and extremely useful at the point such proposal was made, but in recent years the rise in the processing temperature is becoming unavoidable pursuant to the reduction of the wiring width in recent years, and thermal stability at even higher temperatures is being demanded.

[Prior Art Documents]
[Patent Document 1] Japanese Patent Published Unexamined Application No. H7-38104
[Patent Document 2] Japanese Patent Published Unexamined Application No. H9-153616
[Patent Document 3] Japanese Patent Published Unexamined Application No. H11-204791 (U.S. Pat. No. 5,989,988)
[Patent Document 4] Japanese Patent Published Unexamined Application No. H5-94966
[Patent Document 5] Japanese Patent Published Unexamined Application No. 2003-213406
[Patent Document 6] Japanese Patent Published Unexamined Application No. 2003-213406

SUMMARY OF THE INVENTION

An object of the present invention is to provide a nickel alloy sputtering target, and a nickel silicide film formed with such a target, enabling the formation of a thermally stable silicide (NiSi) film, scarcely causes the aggregation of films or excessive formation of silicides, having low generation of particles upon forming the sputtered film, having favorable uniformity and superior plastic workability to the target, and which is particularly effective for the manufacture of a gate electrode material (thin film).

In order to achieve the foregoing object, the present inventors discovered that a target enabling the formation of a thermally stable silicide (NiSi) film, having low generation of particles during sputtering, having favorable uniformity and superior plastic workability can be obtained by adding specific metal elements to high purity nickel together with platinum, and that a nickel silicide film capable of inhibiting the phase change from NiSi to $NiSi_2$ can be obtained by performing deposition using the foregoing target.

Based on the foregoing discovery, the present invention provides:

1) A nickel alloy sputtering target containing 22 to 46 wt % of platinum and 5 to 100 wtppm of one or more components selected from iridium, palladium, and ruthenium, and remainder is nickel and inevitable impurities.

The present invention additionally provides:

2) A nickel silicide film formed by sputtering a nickel alloy sputtering target containing 22 to 46 wt % of platinum and 5 to 100 wtppm of one or more components selected from iridium, palladium, and ruthenium and in which its remainder is nickel and inevitable impurities to form a nickel alloy film on a silicon substrate, and reacting the nickel alloy film and the silicon substrate, wherein a phase change temperature of the nickel silicide film from NiSi to $NiSi_2$ is 750° C. or higher; and 3) The nickel silicide film according to 2) above, wherein the phase change temperature from NiSi to $NiSi_2$ is 800° C. or higher.

In order to overcome the foregoing problems, the present inventors discovered that by adding a special metal element to high purity nickel together with platinum, it is possible to realize a thermally stable silicide (NiSi) deposition, and produce a target with low generation of particles during sputtering, and having favorable uniformity and plastic workability, and that it is further possible to obtain a nickel silicide film capable of inhibiting the phase change from NiSi to $NiSi_2$ by performing deposition using the foregoing target.

BRIEF DESCRIPTION OF THE DRAWINGS

[FIG. 1] A diagram showing the change in sheet resistance based on the heat treatment temperatures of the Examples and Comparative Examples.

DETAILED DESCRIPTION OF THE INVENTION

The target of the present invention is prepared by performing electrolytic refining to rough Ni (up to roughly 4N), removing the metal impurity components, and further refining this with EB melting to obtain a high purity nickel ingot, and subsequently performing vacuum melting to this ingot and high purity platinum to prepare a high purity nickel alloy ingot.

Upon performing vacuum melting, the cold crucible melting method employing a water-cooled copper crucible is suitable. This alloy ingot is subject to forging, rolling and other processes to form a plate shape, and ultimately subject to heat treatment at a recrystallization temperature of (roughly 500° C.) to 950° C. to prepare a target.

The additive amount of platinum is 22 to 46 wt %, more preferably 27 to 37 wt %. If the additive amount of platinum (Pt) is too small, the thermal stability of the nickel alloy layer cannot be improved. If the additive amount is too large, the film resistance will become too large, which will be inappropriate. Besides, there is a problem in that the amount of intermetallic compounds will increase and make the plastic working difficult, and the generation of particles during sputtering will also increase.

The present invention additionally causes the target to contain 5 to 100 wtppm of one or more components selected from iridium (Ir), palladium (Pd), and ruthenium (Ru). These additive elements exist as a solid solution in Ni. By adding these alloy elements, the phase change from NiSi to $NiSi_2$ in the salicide process can be effectively inhibited compared to the case of adding only Pt.

Note that since impurities may also get mixed in pursuant to the addition of the foregoing additive elements, it is desirable to use a high purity produce of 3N level or better for the iridium, palladium, and ruthenium to be added.

Specifically, as a result of performing sputtering with the platinum-added nickel alloy of the present invention, heating this sputtered film under a nitrogen atmosphere, and thereafter measuring the temperature of change in the crystal structure with the XRD diffraction method, the phase change temperature of 50 to 100° C. improved due to the addition of 22 to 46 wt % of platinum and 5 to 100 wtppm of one or more components selected from iridium, palladium, and ruthenium, and apparent thermal stability was confirmed.

Specifically, when a nickel silicide film is formed with the salicide process, it is possible to achieve 750° C. or higher as the phase change temperature from NiSi to $NiSi_2$, and even 800° C. or higher as the phase change temperature from NiSi to $NiSi_2$.

In order to reduce the generation of particles during sputtering and to improve the uniformity, it is desirable to make the inevitable impurities excluding gas components 100 wtppm or less, and more preferably 10 wtppm or less.

Further, since gas components will also cause the increase in the generation of particles, it is desirable to make the content of oxygen 50 wtppm or less, more preferably 10 wtppm or less, and the contents of nitrogen, hydrogen and carbon respectively 10 wtppm or less.

It is important to make the initial magnetic permeability of the target 50 or more (preferably around 100), and the maximum magnetic permeability 100 or more with respect to the sputtering characteristics.

Final heat treatment is performed at a recrystallization temperature (roughly 500° C.) or higher to 950° C. to form a substantial recrystallization structure. If the heat treatment temperature is less than 500° C., sufficient recrystallization structure cannot be obtained. Further, the permeability and maximum magnetic permeability cannot be improved.

In the target of the present invention, although the slight existence of non-recrystallization will not affect the characteristics, a significant amount of such existence is not preferable. It is desirable that the average crystal grain size of the target is 80 μm or less.

A final heat treatment exceeding 950° C. is not preferable as this will enlarge the average crystal grain size. When the average crystal grain size is enlarged, the variation of the crystal grain size will increase, and the uniformity will deteriorate.

EXAMPLES

The present invention is now described with reference to the Examples and Comparative Examples. These Examples are merely illustrative, and the present invention shall in no way be limited thereby. In other words, the present invention shall only be limited by the scope of claim for a patent, and shall include the various modifications other than the Examples of this invention.

Example 1

Rough Ni (up to roughly 4N) was subject to electrolytic refining to remove metal impurity components, this was further refined with EB melting to obtain a high purity nickel ingot (99.999 wt %), and 22.4 wt % of high purity platinum, 2 wtppm of high purity iridium, 2 wtppm of high purity ruthenium and 1 wtppm of high purity palladium having the same level of purity as the foregoing ingot were added, and these were subject to vacuum melting to produce a high purity nickel alloy ingot. Here, note that the total amount of iridium, ruthenium, and palladium will be 5 wtppm. Upon performing vacuum melting to the foregoing material, the cold crucible melting method employing a water-cooled copper crucible was used. The plastic workability to the target was favorable and had no particular problem.

This alloy ingot obtained by melting and casting was subject to forging and rolling to form a plate shape, and ultimately subject to heat treatment at 500 to 950° C. to prepare a target.

The nickel alloy target obtained as described above was sputtered on a silicon substrate, this sputter deposition was further heated in a nitrogen atmosphere, and the temperature of change in the sheet resistance value was measured. Consequently, the phase change temperature of 150 to 200° C. improved compared to the case of adding only platinum, and apparent thermal stability was confirmed. The measurement results of the sheet resistance of the nickel alloy film are shown in FIG. 1.

As evident from FIG. 1, the increase in the sheet resistance value cannot be acknowledged at all at 800° C. or lower. In addition, even when heated at 850° C., the increase in the sheet resistance value was slight. The fact that the sheet resistance value does not increase even upon heating at a high temperature means that the phase change from NiSi to $NiSi_2$ does not occur.

Example 1 is a case of adding three accessory components in a total amount of 5 wtppm; specifically, 2 wtppm of high purity iridium, 2 wtppm of high purity ruthenium, and 1 wtppm of high purity palladium, and the same results were obtained in either case of adding a single component among the foregoing accessory components or combining two among the foregoing accessory components so as long as the total amount to be added was 5 wtppm.

Example 2

As with Example 1, rough Ni (up to roughly 4N) was subject to electrolytic refining to remove metal impurity components, this was further refined with EB melting to obtain a high purity nickel ingot (99.999 wt %). Subsequently, 22.4 wt % of high purity platinum, 5 wtppm of high purity iridium, 5 wtppm of high purity ruthenium and 5 wtppm of high purity palladium having the same level of purity as the foregoing ingot were added, and these were subject to vacuum melting to produce a high purity nickel alloy ingot. Here, note that the total amount of iridium, ruthenium, and palladium will be 15 wtppm. Upon performing vacuum melting to the foregoing material, the cold crucible melting method employing a water-cooled copper crucible was used. The plastic workability to the target was favorable and had no particular problem.

This alloy ingot obtained by melting and casting was subject to forging and rolling to form a plate shape, and ultimately subject to heat treatment at 500 to 950° C. to prepare a target.

The nickel alloy target obtained as described above was sputtered on a silicon substrate, this sputter deposition was further heated in a nitrogen atmosphere, and the temperature of change in the sheet resistance value was measured. Consequently, as with Example 1, the phase change temperature of 150 to 200° C. improved compared to the case of adding only platinum, and apparent thermal stability was confirmed. The measurement results of the sheet resistance of the nickel alloy film are shown in FIG. 1.

As evident from FIG. 1, the increase in the sheet resistance value cannot be acknowledged at all at 800° C. or lower. In addition, even when heated at 850° C., the increase in the sheet resistance value was slight. The fact that the sheet resistance value does not increase even upon heating at a high temperature means that the phase change from NiSi to $NiSi_2$ does not occur.

Example 2 is a case of adding three accessory components in a total amount of 15 wtppm; specifically, 5 wtppm of high purity iridium, 5 wtppm of high purity ruthenium, and 5 wtppm of high purity palladium, and the same results were obtained in either case of adding a single component among the foregoing accessory components or combining two among the foregoing accessory components so as long as the total amount to be added was 15 wtppm.

Example 3

As with Example 1, rough Ni (up to roughly 4N) was subject to electrolytic refining to remove metal impurity components, and this was further refined with EB melting to obtain a high purity nickel ingot (99.999 wt %).

Subsequently, 27 wt % of high purity platinum, 8 wtppm of high purity iridium, 8 wtppm of high purity ruthenium and 9 wtppm of high purity palladium having the same level of purity as the foregoing ingot were added, and these were subject to vacuum melting to produce a high purity nickel alloy ingot. Here, note that the total amount of iridium, ruthenium, and palladium will be 25 wtppm.

Upon performing vacuum melting to the foregoing material, the cold crucible melting method employing a water-cooled copper crucible was used. The plastic workability to the target was favorable and had no particular problem.

This alloy ingot obtained by melting and casting was subject to forging and rolling to form a plate shape, and ultimately subject to heat treatment at 500 to 950° C. to prepare a target.

The nickel alloy target obtained as described above was sputtered on a silicon substrate, this sputter deposition was further heated in a nitrogen atmosphere, and the temperature of change in the sheet resistance value was measured. Consequently, as with Example 1, the phase change temperature of 150 to 200° C. improved compared to the case of adding only platinum, and apparent thermal stability was confirmed. The measurement results of the sheet resistance of the nickel alloy film are shown in FIG. 1.

As evident from FIG. 1, the increase in the sheet resistance value cannot be acknowledged at all at 800° C. or lower. In addition, even when heated at 850° C., the increase in the sheet resistance value was slight. The fact that the sheet resistance value does not increase even upon heating at a high temperature means that the phase change from NiSi to $NiSi_2$ does not occur.

Example 3 is a case of adding three accessory components in a total amount of 25 wtppm; specifically, 8 wtppm of high purity iridium, 8 wtppm of high purity ruthenium, and 9 wtppm of high purity palladium, and the same results were obtained in either case of adding a single component among the foregoing accessory components or combining two among the foregoing accessory components so as long as the total amount to be added was 25 wtppm.

Example 4

As with Example 1, rough Ni (up to roughly 4N) was subject to electrolytic refining to remove metal impurity components, this was further refined with EB melting to obtain a high purity nickel ingot (99.999 wt %). Subsequently, 45.4 wt % of high purity platinum, 20 wtppm of high purity iridium, 20 wtppm of high purity ruthenium and 10 wtppm of high purity palladium having the same level of purity as the foregoing ingot were added, and these were subject to vacuum melting to produce a high purity nickel alloy ingot. Here, note that the total amount of iridium, ruthenium, and palladium will be 50 wtppm. Upon performing vacuum melting to the foregoing material, the cold crucible melting method employing a water-cooled copper crucible was used. Though the plastic workability to the target was slightly inferior to the foregoing Examples, working was possible.

This alloy ingot obtained by melting and casting was subject to forging and rolling to form a plate shape, and ultimately subject to heat treatment at 500 to 950° C. to prepare a target.

The nickel alloy target obtained as described above was sputtered on a silicon substrate, this sputter deposition was further heated in a nitrogen atmosphere, and the temperature of change in the sheet resistance value was measured. Consequently, as with Example 1, the phase change temperature of 150 to 200° C. improved compared to the case of adding only platinum, and apparent thermal stability was confirmed. The measurement results of the sheet resistance of the nickel alloy film are shown in FIG. 1.

As evident from FIG. 1, the increase in the sheet resistance value cannot be acknowledged at all at 800° C. or lower. In addition, even when heated at 850° C., the increase in the sheet resistance value was slight. The fact that the sheet resistance value does not increase even upon heating at a high temperature means that the phase change from NiSi to $NiSi_2$ does not occur.

Example 4 is a case of adding three accessory components in a total amount of 50 wtppm; specifically, 20 wtppm of high purity iridium, 20 wtppm of high purity ruthenium, and 10 wtppm of high purity palladium, and the same results were obtained in either case of adding a single component among the foregoing accessory components or combining two among the foregoing accessory components so as long as the total amount to be added was 50 wtppm.

Example 5

As with Example 1, rough Ni (up to roughly 4N) was subject to electrolytic refining to remove metal impurity components, and this was further refined with EB melting to obtain a high purity nickel ingot (99.999 wt %).

Subsequently, 46 wt % of high purity platinum, 40 wtppm of high purity iridium, 40 wtppm of high purity ruthenium and 20 wtppm of high purity palladium having the same level of purity as the foregoing ingot were added, and these were subject to vacuum melting to produce a high purity nickel alloy ingot. Here, note that the total amount of iridium, ruthenium, and palladium will be 100 wtppm.

Upon performing vacuum melting to the foregoing material, the cold crucible melting method employing a water-cooled copper crucible was used. Though the plastic workability to the target was slightly difficult, working was possible.

This alloy ingot obtained by melting and casting was subject to forging and rolling to form a plate shape, and ultimately subject to heat treatment at 500 to 950° C. to prepare a target.

The nickel alloy target obtained as described above was sputtered on a silicon substrate, this sputter deposition was further heated in a nitrogen atmosphere, and the temperature of change in the sheet resistance value was measured. Consequently, as with Example 1, the phase change temperature of 150 to 200° C. improved compared to the case of adding only platinum, and apparent thermal stability was confirmed. The measurement results of the sheet resistance of the nickel alloy film are not particularly shown, but they showed a similar tendency as with the previous Examples.

Here, as with Example 4, the increase in the sheet resistance value cannot be acknowledged at all at 800° C. or lower. In addition, even when heated at 850° C., the increase in the sheet resistance value was slight. The fact that the sheet resistance value does not increase even upon heating at a high temperature means that the phase change from NiSi to $NiSi_2$ does not occur.

Example 5 is a case of adding three accessory components in a total amount of 100 wtppm; specifically, 40 wtppm of high purity iridium, 40 wtppm of high purity ruthenium, and 20 wtppm of high purity palladium, and the same results were obtained in either case of adding a single component among the foregoing accessory components or combining two among the foregoing accessory components so as long as the total amount to be added was 100 wtppm.

Comparative Example 1

As with Example 1, rough Ni (up to roughly 4N) was subject to electrolytic refining to remove metal impurity components, and this was further refined with EB melting to obtain a high purity nickel ingot (99.999 wt %).

Subsequently, without adding platinum, 0.3 wtppm of high purity iridium, 0.3 wtppm of high purity ruthenium and 0.2 wtppm of high purity palladium having the same level of purity as the foregoing ingot were added, and these were subject to vacuum melting to produce a high purity nickel alloy ingot. Here, note that the total amount of iridium, ruthenium, and palladium will be 0.8 wtppm.

Upon performing vacuum melting to the foregoing material, the cold crucible melting method employing a water-cooled copper crucible was used. The plastic workability to the target was favorable and had no particular problem.

This alloy ingot obtained by melting and casting was subject to forging and rolling to form a plate shape, and ultimately subject to heat treatment at 500 to 950° C. to prepare a target.

The nickel alloy target obtained as described above was sputtered on a silicon substrate, this sputter deposition was further heated in a nitrogen atmosphere, and the temperature of change in the sheet resistance value was measured. Consequently, compared to Example 1, the phase change temperature increased rapidly at 550° C. or higher, and the thermal stability deteriorated considerably. The measurement results of the sheet resistance of the nickel alloy film are shown in FIG. 1.

As evident from FIG. 1, it was confirmed that the increase in the sheet resistance value becomes significant upon exceeding 550° C. The fact that the sheet resistance value increased significantly even upon heating at a low temperature means that the phase change from NiSi to NiSi$_2$ occurred.

Comparative Example 1 is a case of adding three accessory components in a total amount of 0.8 wtppm; specifically, 0.3 wtppm of high purity iridium, 0.3 wtppm of high purity ruthenium, and 0.2 wtppm of high purity palladium, and the same inferior results were obtained in either case of adding a single component among the foregoing accessory components or combining two among the foregoing accessory components so as long as the total amount to be added was 0.8 wtppm.

Comparative Example 2

As with Example 1, rough Ni (up to roughly 4N) was subject to electrolytic refining to remove metal impurity components, this was further refined with EB melting to obtain a high purity nickel ingot (99.999 wt %). Subsequently, 14.9 wt % of platinum was added, and 1 wtppm of high purity iridium, 1 wtppm of high purity ruthenium and 1 wtppm of high purity palladium were further added, and these were subject to vacuum melting to produce a high purity nickel alloy ingot. Here, note that the total amount of iridium, ruthenium, and palladium will be 3 wtppm. The additive amount of platinum and the additive amount of iridium, ruthenium, and palladium do not satisfy the conditions of the present invention. Upon performing vacuum melting to the foregoing material, the cold crucible melting method employing a water-cooled copper crucible was used. The plastic workability to the target was favorable and had no particular problem.

This alloy ingot obtained by melting and casting was subject to forging and rolling to form a plate shape, and ultimately subject to heat treatment at 500 to 950° C. to prepare a target.

The nickel alloy target obtained as described above was sputtered on a silicon substrate, this sputter deposition was further heated in a nitrogen atmosphere, and the temperature of change in the sheet resistance value was measured. Consequently, compared to Example 1, the phase change temperature increased rapidly at 550° C. or higher, and the thermal stability deteriorated considerably. The measurement results of the sheet resistance of the nickel alloy film are shown in FIG. 1.

As evident from FIG. 1, it was confirmed that the sheet resistance value once decreased at 600° C. upon exceeding 550° C., but the increase becomes significant at 650° C. or higher. The fact that the sheet resistance value increased significantly even upon heating at a low temperature of 650° C. means that the phase change from NiSi to NiSi$_2$ occurred.

Comparative Example 2 is a case of adding three accessory components in a total amount of 3 wtppm; specifically, 1 wtppm of high purity iridium, 1 wtppm of high purity ruthenium, and 1 wtppm of high purity palladium in addition to the 14.9 wt % of platinum, and the same inferior results were obtained in either case of adding a single component among the foregoing accessory components or combining two among the foregoing accessory components so as long as the total amount to be added was 3 wtppm.

Comparative Example 3

As with Example 1, rough Ni (up to roughly 4N) was subject to electrolytic refining to remove metal impurity components, this was further refined with EB melting to obtain a high purity nickel ingot (99.999 wt %). Subsequently, 20 wt % of platinum was added, and 10 wtppm of high purity iridium, 10 wtppm of high purity ruthenium and 10 wtppm of high purity palladium were further added, and these were subject to vacuum melting to produce a high purity nickel alloy ingot. Here, note that the total amount of iridium, ruthenium, and palladium will be 30 wtppm. The additive amount of platinum was less than the 22 wt % of the present invention, and does not satisfy the conditions of the present invention. Note that the additive amounts of iridium, ruthenium, and palladium respectfully satisfy the conditions of the present invention. Upon performing vacuum melting to the foregoing material, the cold crucible melting method employing a water-cooled copper crucible was used. The plastic workability to the target was favorable and had no particular problem.

This alloy ingot obtained by melting and casting was subject to forging and rolling to form a plate shape, and ultimately subject to heat treatment at 500 to 950° C. to prepare a target.

The nickel alloy target obtained as described above was sputtered on a silicon substrate, this sputter deposition was further heated in a nitrogen atmosphere, and the temperature of change in the sheet resistance value was measured. Consequently, compared to Example 1, the phase change temperature increased rapidly at 750° C. or higher, and the thermal stability deteriorated considerably. The measurement results of the sheet resistance of the nickel alloy film are shown in FIG. 1.

As evident from FIG. 1, it was confirmed that the sheet resistance value increased upon exceeding 700° C., and the increase becomes significant upon exceeding 750° C. The fact that the sheet resistance value increased significantly even upon heating at a temperature of roughly 750° C. means that the phase change from NiSi to NiSi$_2$ occurred.

Comparative Example 3 is a case of adding three accessory components in a total amount of 30 wtppm; specifically, 10 wtppm of high purity iridium, 10 wtppm of high purity ruthenium, and 10 wtppm of high purity palladium, and the same inferior results were obtained in either case of adding a single component among the foregoing accessory components or combining two among the foregoing accessory components so as long as the total amount to be added was 30 wtppm since the additive amount of platinum was low at 20 wt %.

Comparative Example 4

As with Example 1, rough Ni (up to roughly 4N) was subject to electrolytic refining to remove metal impurity components, and this was further refined with EB melting to obtain a high purity nickel ingot (99.999 wt %).

Subsequently, 27 wt % of platinum was added, and 1 wtppm of high purity iridium, 1 wtppm of high purity ruthenium and 2 wtppm of high purity palladium were further added, and these were subject to vacuum melting to produce a high purity nickel alloy ingot. Here, note that the total amount of iridium, ruthenium, and palladium will be 4 wtppm. The additive amount of platinum satisfies the conditions of the present invention since it is 22 wt % or more of the present invention. Note that the additive amounts of iridium, ruthenium, and palladium do not satisfy the conditions of the present invention of 5 wtppm or more.

Upon performing vacuum melting to the foregoing material, the cold crucible melting method employing a water-cooled copper crucible was used. The plastic workability to the target was favorable and had no particular problem.

This alloy ingot obtained by melting and casting was subject to forging and rolling to form a plate shape, and ultimately subject to heat treatment at 500 to 950° C. to prepare a target.

The nickel alloy target obtained as described above was sputtered on a silicon substrate, this sputter deposition was further heated in a nitrogen atmosphere, and the temperature of change in the sheet resistance value was measured. Consequently, compared to Example 1, the phase change temperature increased rapidly at 750° C. or higher, and the thermal stability deteriorated considerably. The measurement results of the sheet resistance of the nickel alloy film are shown in FIG. 1.

As evident from FIG. 1, it was confirmed that the sheet resistance value increased upon exceeding 700° C., and the increase becomes significant upon exceeding 750° C. The fact that the sheet resistance value increased significantly even upon heating at a temperature of roughly 750° C. means that the phase change from NiSi to $NiSi_2$ occurred. Although there is considerable improvement compared to Comparative Example 1 to Comparative Example 3, the improvement intended by the present invention was not achieved.

Comparative Example 4 is a case of adding three accessory components in a total amount of 4 wtppm; specifically, 1 wtppm of high purity iridium, 1 wtppm of high purity ruthenium, and 2 wtppm of high purity palladium, and slightly inferior results were obtained in either case of adding a single component among the foregoing accessory components or combining two among the foregoing accessory components so as long as the total amount to be added was 4 wtppm even when the additive amount of platinum was 27 wt % and satisfied the conditions of the present invention.

As described above, the nickel alloy sputtering target obtained by adding 22 to 46 wt % of platinum and 5 to 100 wtppm of one or more components selected from iridium, palladium, and ruthenium to nickel enables the formation of a thermally stable silicide (NiSi) film, scarcely causes the aggregation of films or excessive formation of silicides, has low generation of particles upon forming the sputtered film, has favorable uniformity and superior plastic workability to the target, and is particularly effective for the manufacture of a gate electrode material (thin film). Thus, it is possible to provide a nickel alloy sputtering target that is particularly effective for the production of a gate electrode material (thin film).

The invention claimed is:

1. A nickel alloy sputtering target containing 22 to 46 wt % of platinum and 5 to 100 wtppm of one or more components selected from iridium, palladium, and ruthenium, and remainder is nickel and inevitable impurities.

\* \* \* \* \*